United States Patent [19]
Furuya et al.

[11] Patent Number: 5,568,500
[45] Date of Patent: Oct. 22, 1996

[54] SEMICONDUCTOR LASER

[75] Inventors: Akira Furuya; Chikashi Anayama; Makoto Kondo, all of Kawasaki, Japan

[73] Assignee: Fujitsu Limited, Kanagawa, Japan

[21] Appl. No.: 212,790

[22] Filed: Mar. 15, 1994

[30] Foreign Application Priority Data

Apr. 15, 1993 [JP] Japan ................................. 5-088582

[51] Int. Cl.⁶ ........................................................ H01S 3/18
[52] U.S. Cl. ................................. 372/46; 372/44; 372/48
[58] Field of Search ................................. 372/43–47, 48

[56] References Cited

U.S. PATENT DOCUMENTS

| | | | |
|---|---|---|---|
| 4,581,743 | 4/1986 | Fujimoto | 372/46 |
| 4,667,332 | 5/1987 | Mihashi et al. | 372/45 |
| 4,757,509 | 7/1988 | Isshiki et al. | 372/45 |
| 4,815,082 | 3/1989 | Isshiki et al. | 372/45 |
| 5,115,443 | 5/1992 | Miyazawa | 372/46 |
| 5,255,281 | 10/1993 | Sugano et al. | 372/46 |

FOREIGN PATENT DOCUMENTS

| | | | |
|---|---|---|---|
| 57-23924 | 2/1982 | Japan | 372/92 |
| 1-183190 | 7/1989 | Japan . | |
| 5-82892 | 4/1993 | Japan . | |

*Primary Examiner*—Rodney B. Bovernick
*Assistant Examiner*—Robert McNutt
*Attorney, Agent, or Firm*—Staas & Halsey

[57] ABSTRACT

The semiconductor laser of the present invention has an active layer in which the output edge is formed into a V-shape or comprises a striped active layer which is present in a pumped region and whose light output edge is transversely bent.

11 Claims, 14 Drawing Sheets

LIGHT

SEMICONDUCTOR LASER

BACKGROUND OF THE INVENTION

1. Field of the Invention

The present invention relates to a semiconductor laser, particularly to a semiconductor laser used for a light source for reading optical information and a module for optical communication.

2. Description of the Related Art

An edge-emitting semiconductor laser comprises n-type and p-type cladding layers with a low refractive index and an active layer with a high refractive index formed between the cladding layers so as to emit light from the edge of the active layer. The energy band gap of the cladding layers is larger than that of the active layer.

Various structures are proposed to control the transverse mode of the semiconductor laser. There are the flection waveguide type in which an active layer is terraced and the rib type in which a region along a waveguide of an active layer is thickened.

There are many various structures of the flection waveguide, and some of them are described as follows.

FIG. 1 is a perspective view showing the first embodiment of a semiconductor laser according to the prior art which is described in Japanese unexamined publication (KOKAI) Hei 2-77124.

This semiconductor laser comprises an n-GaAs substrate 101 having a groove 102 formed on the (001) plane of the n-GaAs substrate 101; an n-GaAs buffer layer 103, an n-AlGaInP cladding layer 104, an InGaP active layer 105, a p-AlGaInP cladding layer 106, a p-InGaP layer 107, and an n-GaAs current constriction layer 108 formed in order on the n-GaAs substrate 101; and a contact layer 109 in which Zn is diffused in the current constriction layer 108 above the groove 101.

In the case of the above constitution, the cladding layers 104 and 106 and the active layer 105 are also flexed according to the concave and convex of the groove 102 and a striped pumped region (gain region) is formed on the active layer 105 put between two side slopes. Therefore, a laser beam emitted from the edge of the pumped region has a small astigmatism and a preferable characteristic is realized.

FIG. 2 is a front view showing the second embodiment of a semiconductor laser according to the prior art which is described in Japanese unexamined publication (KOKAI) Hei 5-82892.

For this semiconductor laser, the structure of the layers from the n-GaAs substrate 101 to the active layer 105 is the same as that in FIG. 1. However, the structure is different from that in FIG. 1 in that a p-AlGaInP cladding layer 110 formed on the active layer 105 protrudes like a mesa along a waveguide, a p-GaAs layer 112 is further formed on the protruded portion of the cladding layer 110 through a p-InGaP layer 111, and a current constriction layer 114 made of n-GaAs is formed at the both sides of a convex portion 113 produced to these layers 110, 111 and 112, and moreover a p-GaAs contact layer 115 is formed on the current constriction layer 114 and the convex portion 113.

This type of device realizes a low-threshold and high-efficient laser operation, because the current constriction layer 114 approaches the vicinity of the active layer 105 along the wave guide.

FIG. 3 is a perspective view showing the third related art of a semiconductor laser which is described in Japanese application of No. Hei 5-58288 but not disclosed. One of the inventors of the application is an inventor of the present invention.

This semiconductor laser comprises the GaAs substrate 101 having a groove 117, and the groove 117 near by a light outputting edge is narrower than the opposite edge by changing the width of the groove 117 by stages or continuously. Thereby it is possible to decrease excess noises induced by optical feedback because the mode volume of the laser increases and multiple-mode oscillation is performed.

In FIG. 3, laminated structures other than the above are the same as those of the semiconductor laser shown in FIG. 2 and the same symbol shows the same element. Therefore, the description of them is omitted in this case.

FIG. 4 is a perspective view showing the fourth related art of a semiconductor laser which is described in Japanese application of No. Hei 4-250286 but not disclosed. One of the inventors of the application is an inventor of the present invention.

This semiconductor laser is constituted by forming a different composition of semiconductor layer on a main surface of an n-GaAs substrate 120 having a plane being 6° off to the <110> direction (direction A) from the (001) plane. There is a terrace on the main surface of the n-GaAs substrate 120, the difference in level of the terrace is extended along the <1 $\bar{1}$0> direction and a slope 121 tilted toward the direction A by approx. 20° is formed on the difference in level. On the n-GaAs substrate 120, an n-$(Al_{0.7}Ga_{0.3})$InP cladding layer 122, an InGaP active layer 123, a p-$(Al_{0.7}Ga_{0.3})$InP cladding layer 124, a Zn—Se simultaneous-doping AlGaInP layer 125, a p-$(A_{10.7}Ga_{0.3})$InP layer 126, a p-InGaP layer 127, and a p-GaAs contact layer 128 are formed in order on the main surface.

The slope 121 has the A-plane into which a VI-group dopant is more easily incorporated than a II-group dopant when film is formed by means of MOVPE. By doping II- and VI-group elements in the time of forming a semiconductor film, only a semiconductor layer on the slope 121 is transformed into the p-type and other flat regions are transformed into the n-type. The AlGaInP layer 125 is formed by this Zn—Se simultaneous-doping method. Thus, a p-type layer is formed on the slope of the active layer 123 and an n-type layer is formed on other regions. As a result, a pnp current constriction structure is formed at the both sides of the slope 121 and the active layer 123 along the slope 121 serves as a pumped region.

Though not illustrated, an electrode is formed on the bottom of reach substrate and the top of the contact layer.

Because each of the above active layers has a small energy band gap and its edge is brought under a high light-density state when a laser beam is emitted, light absorption due to non-radiative recombination occurs at the edge. When the output of a semiconductor laser increases, the light absorption of the active layer increases, and the temperature rises at the edge. Therefore, the energy band gap is further decreased due to the temperature rise and the light absorption value further increases. Thus, a COD (Catastrophic Optical Mirror Damage) breakdown occurs. The COD breakdown occurs at an output of approx. 60 mW in each semiconductor laser described above.

In this case, it is considered to decrease the light density at the edge of an active layer and to increase the output by widening the stripe width of the active layer. However, this structure is not proper because a laser beam does not greatly diverge in the direction of the stripe width of the active layer, the aspect ratio of emitted light increases, and the shape of the laser beam becomes far from a circle which is requested for application of equipment.

SUMMARY OF THE INVENTION

It is an object of the present invention to provide a semiconductor laser hardly causing a COD breakdown without increasing the output edge width of a stripe active layer.

For the present invention, the output edge of an active layer along a waveguide is formed into V-shape and the opposite edge is made flat. In this case, an active layer formed by MOVPE has a natural supper lattice structure in a flat region but it is disordered at a V-shaped portion.

Because the disordered layer has a larger energy band gap than the layer having the natural supper lattice structure, the light absorption at an output edge decreases and the output energy, to cause the COD breakdown, increases.

By forming the light output edge of the active layer into V-shape, light is emitted from the vertex of the V-shape. As the divergence of the emitting edge width is decreased, the divergence of the laser beam increases.

Moreover, by making the V-shaped output edge of an active layer narrower than the edge of the opposite side, return optical noises decrease. Moreover, by forming a current stopping layer on the V-shaped light output edge, the edge becomes a non-current-injection region and the temperature rise of the edge is further suppressed. Therefore, the output energy to cause the COD breakdown further increases.

In the case of another embodiment of the present invention, the edge of the striped pumped region of an active layer is bent transversely off a light advancing direction. The pumped region of the active layer is formed on the striped ridge of a cladding layer, or the striped groove of the layer, or the slope of a terrace.

As the portion nearby the edge of the striped pumped region of the active layer is transversely bent off a light advancing direction, the edge of the cladding layer holding the active layer or the edge of the current constriction structure formed at both sides of the pumped region serves as an actual light output edge. These layers are made of materials with a large energy band gap in order to confine carriers in the active layer. Therefore, the energy band gap of a light output edge also widens, the light absorption decreases and, the output energy, to cause the COD breakdown, increases.

Moreover, by forming a current stopping layer on a cladding layer at an output edge, the light recombinations in the region decrease and the carrier density at the light output edge decreases.

DESCRIPTION OF THE PREFERRED EMBODIMENTS (First embodiment)

Figure 1:
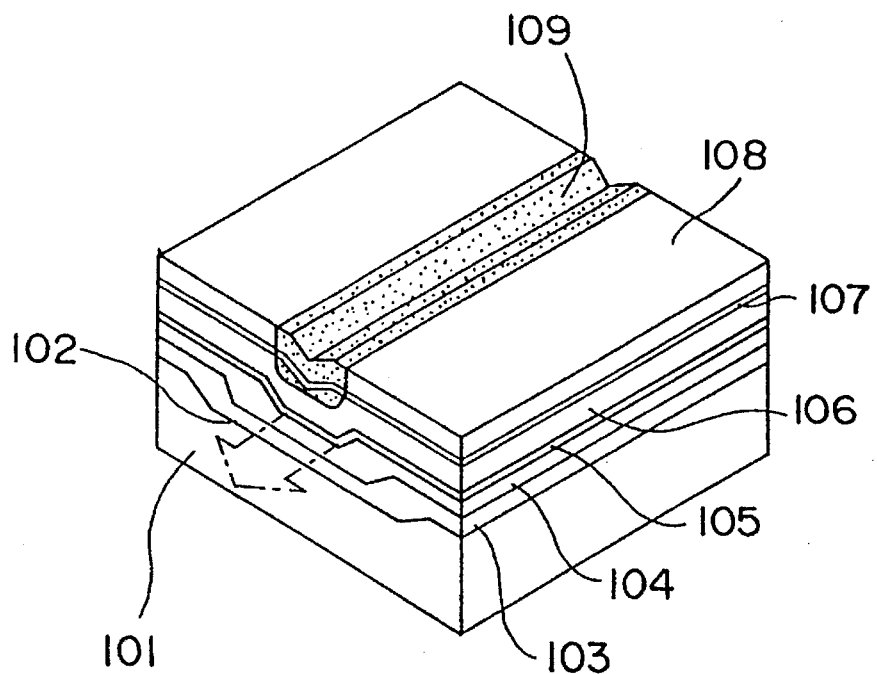
FIG. 1 is a perspective view showing the first embodiment of a semiconductor laser according to the prior art.
Figure 2:
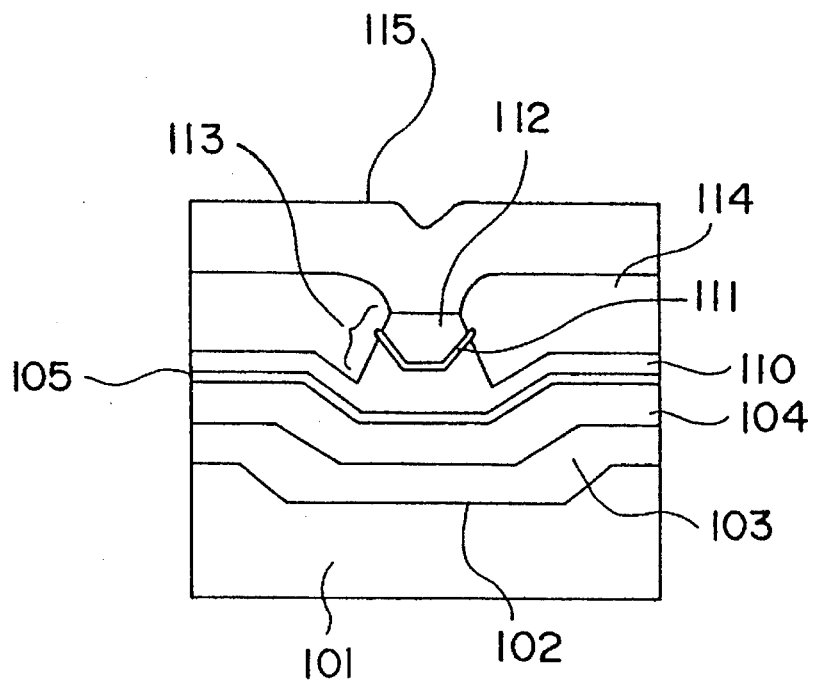
FIG. 2 is a sectional view showing the second embodiment of a semiconductor laser according to the prior art.
Figure 3:
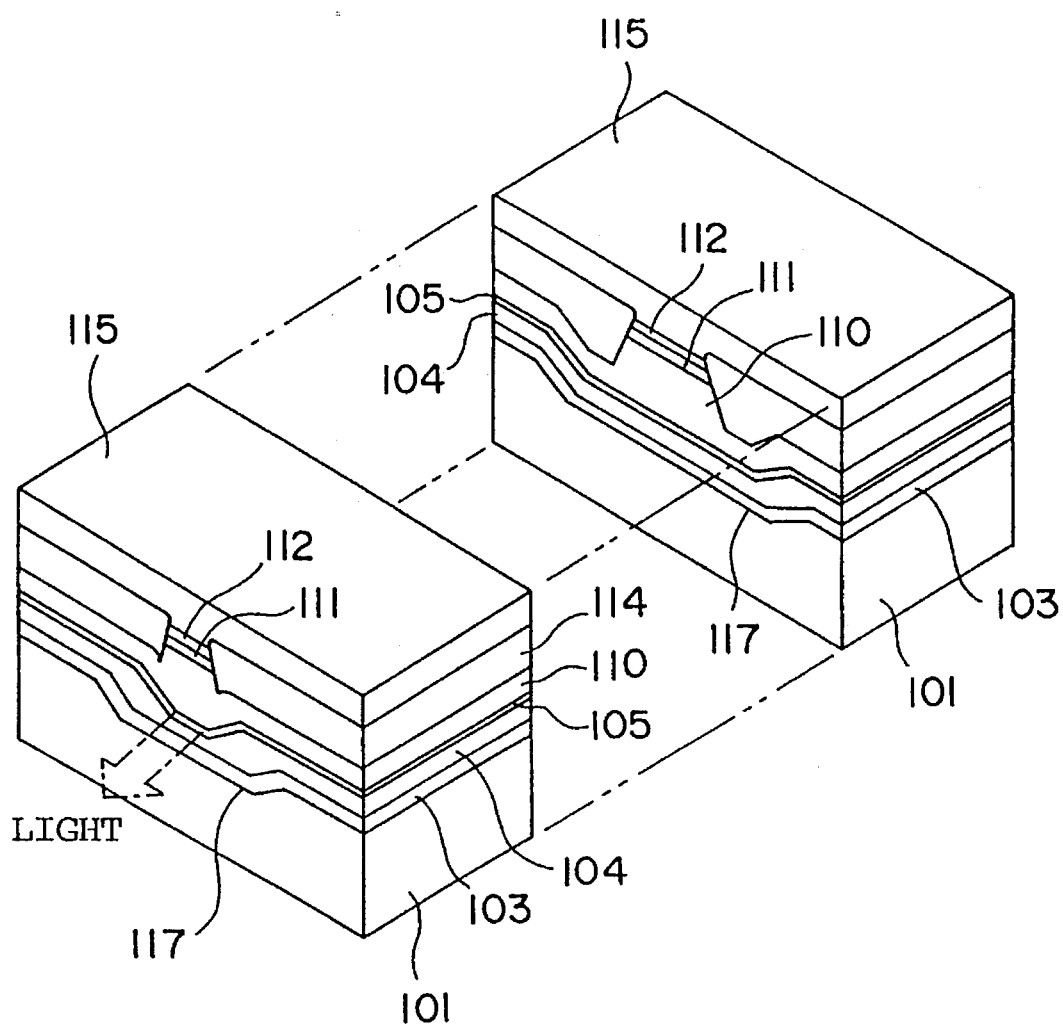
FIG. 3 is a perspective sectional view showing the third embodiment of a semiconductor laser according to the related art.
Figure 4:
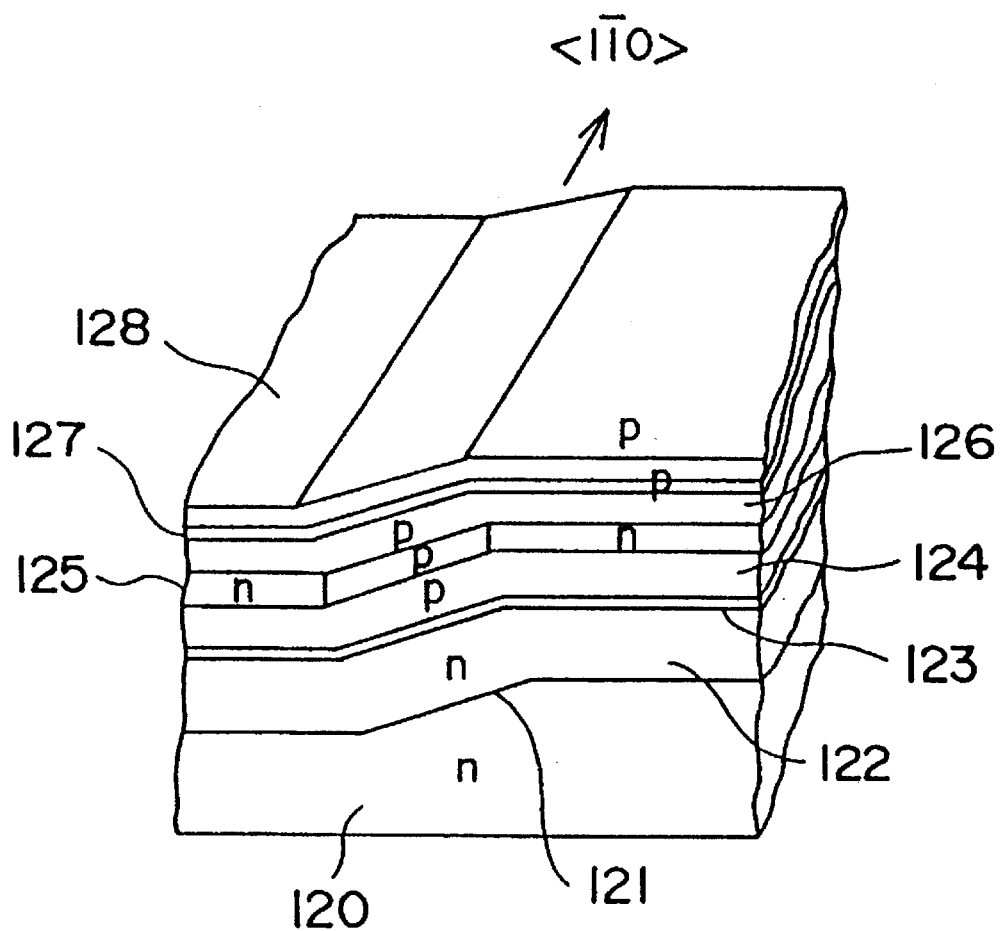
FIG. 4 is a perspective view showing the fourth embodiment of a semiconductor laser according to the related art.
Figure 5:
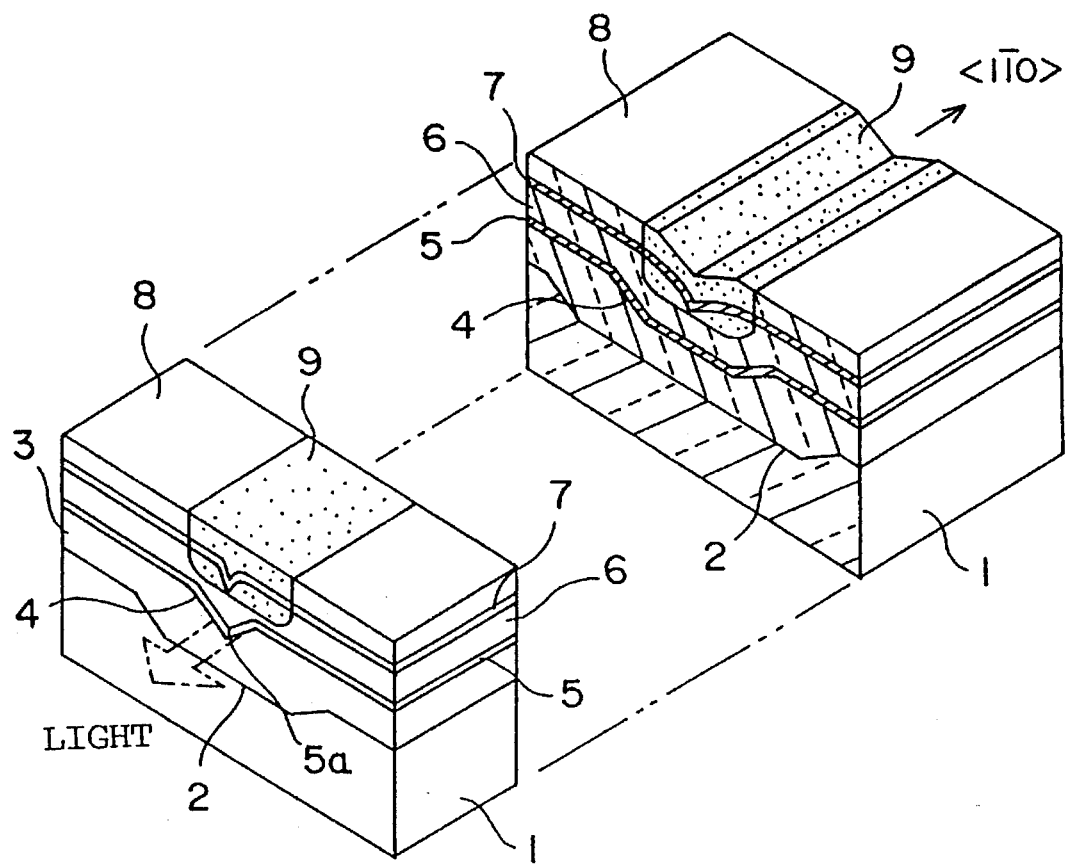
FIG. 5 is a perspective sectional view showing the semiconductor laser of the first embodiment of the present invention.

FIG. 5 is a perspective sectional view of the semiconductor laser showing the first embodiment of the present invention.

In FIG. 5, a groove 2 extending in the <1 $\overline{1}$0> direction is formed on the (001) plane of an n-GaAs substrate 1. The width of the groove 2 changes continuously or by stages, which decreases to approx. 10 μm the light emitting edge and is kept at approx. 16 μm in the portion nearby the opposite edge. A mesa-shaped slope 2a, which can be observed from the top is formed at the both sides of the groove 2, and the slope 2a has a plane tilted by approx. 10° toward the <110> direction on the substrate main surface, that is, an A-plane.

An n-AlGaInP cladding layer 3 with the impurity concentration of $7 \times 10^{17}/cm^3$ is formed on the n-GaAs substrate 1 up to the film thickness of 2 μm by means of MOVPE. For the n-AlGaInP cladding layer 3, a V-shaped slope 4 with a width of approx. 5 μm is produced due to the influence of the shape of the groove 2 in the vicinity of the light output edge, and the slope 4 becomes the so-called A-plane. An approximately-U-shaped concave portion is formed on the cladding layer 3 above the portion where the groove 2 is wide.

A non-doped InGaP active layer 5 with the thickness of 0.03 μm is formed on the top of the n-AlGaInP cladding layer 3, which has relief along the surface shape of the cladding layer 3. A striped pumped region is formed due to curvature above the groove 2.

It is known that component elements of the compound semiconductor formed by MOVPE are disorderly arranged on the slope (A-plane) and are formed natural super lattice on flat planes. Disorderly InGaP has a large energy band gap compared with natural super lattice InGaP. Therefore, the V-shaped slope 4 in the active layer 5 has larger energy band gap than other flat regions. This portion serves as an energy band gap increase portion 5a.

For the layer constitution of this embodiment, the difference of energy band gap between the natural super lattice portion and the disorderly portion is approx. 30 meV.

Moreover, a p-AlGaInP cladding layer 6 with the thickness of 2 μm and the impurity concentration of $7 \times 10^{17}/cm^3$, a p-InGaP layer 7 with the thickness of 0.1 μm and the impurity concentration of $2 \times 10^{18}/cm^3$, and an n-GaAs layer 8 with the thickness of 2 μm and the impurity concentration of $5 \times 10^{18}/cm^3$ are formed on the active layer 5. Furthermore, a p-GaAs contact layer 9 is formed in the upper region of the groove 2 of the n-GaAs layer 8 by diffusing Zn. Thereby a current constriction structure due to an npn junction is produced at both sides of the striped pumped region.

Though not illustrated, a low-reflectance film with a reflectance of 2 to 20% is formed on the cleavage plane where the output edge of the active layer 5 is exposed and a high-reflectance film with a reflectance of 70 to 100% is formed on the plane opposite to the cleavage plane. Moreover, a p-electrode is formed on the contact layer 9 and an n-electrode is formed at the bottom of the substrate 1.

In the case of this embodiment, the edge of the active layer 5 from which light is emitted is a disorderly InGaP layer and has a window structure having larger energy band gap than a natural super lattice structure. Therefore, in the region, the light absorbing capacity decreases and the output causing a COD breakdown increases.

Moreover, because the light is propagated at the edge along the vertex portion of the V-shaped active layer 5, the divergence of the light in the transverse direction at the edge is suppressed, the astigmatic difference decreases, and the beam aspect ratio of the emitted light is preferably kept.

(Second embodiment)

For the above embodiment, the contact layer 9 is formed by diffusing Zn in the n-GaAs layer 8 and current is constricted by the n-GaAs layer 8. It is also possible to form the p-side cladding layer 6 into a ridge structure and form a current constriction layer at both sides of the cladding layer 6. An embodiment witch the structure is described below.

Figure 6:
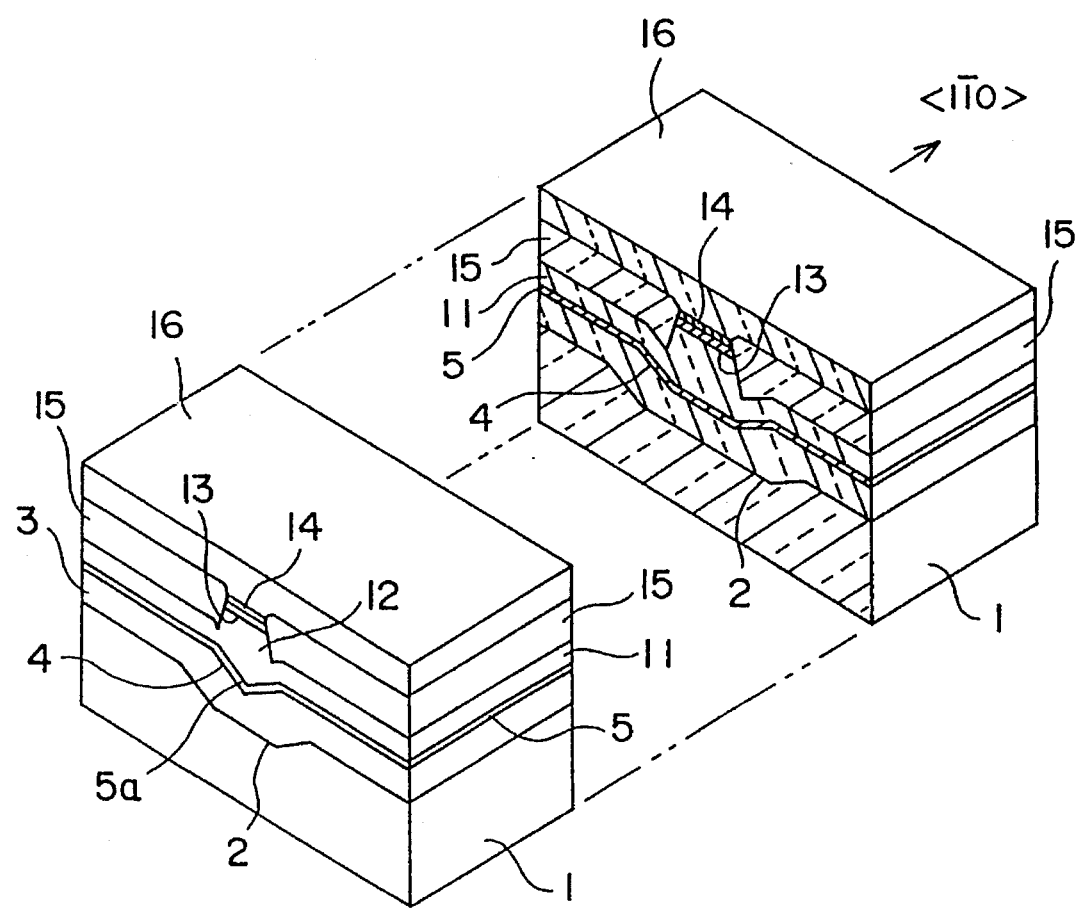
FIG. 6 is a perspective sectional view showing the semiconductor laser of the second embodiment of the present invention.

FIG. 6 is a perspective sectional view of the semiconductor laser showing the second embodiment of the present invention, in which a symbol same as that in FIG. 5 shows the same element.

In FIG. 6, a groove 2 extending in the <1 1̄0> direction whose one edge is narrowed is formed on the (001) plane of an n-GaAs substrate 1 similarly to the case of the first embodiment. Moreover, in an n-AlGaInP cladding layer 3 formed on the substrate 1, the top face of a portion corresponding to the narrowed portion of the groove 2 is a V-shaped slope (A-plane) 4.

Moreover, a non-doped InGaP active layer 5 is formed on the n-AlGaInP cladding layer 3, the portion of the layer 5 above the groove 2 serves as a pumped region, and disorderly InGaP serving as an energy band gap increase portion 5a is present on the V-shaped portion at the output edge of the layer 5.

Furthermore, a p-AlGaInP cladding layer 11 is formed on the active layer 5 and a mesa-shaped convex portion 12 is formed on a portion of the layer 11 above the groove 2. A p-InGaP layer 13 and a p-GaAs layer 14 are formed on the convex portion 12 and an n-GaAs current constriction layer 15 is formed at the both sides of the layers 13 and 14. Furthermore, a p-GaAs contact layer 16 is formed on the current constriction layer 15 and the p-GaAs layer 14.

Though not illustrated, a low-reflectance film with a reflectance of 2 to 20% is formed on the cleavage plane where the output edge of the active layer 5 is exposed and a high-reflectance film with a reflectance of 70 to 100% is formed on the plane opposite to the cleavage plane so as to emit light from the energy band gap increase portion 5a of the active layer 5 at the low-reflectance film side. Moreover, a p-electrode is formed on the contact layer 16 and an n-electrode is formed on the bottom of the substrate 1.

Because the energy band Gap increase portion 5a made of disorderly InGaP is present at the light output edge of the active layer 5 of the semiconductor laser similarly to the case of the first embodiment, the capacity for absorbing the light outputted from here decreases compared with that of the other portion and the output energy to cause a COD breakdown increases. Moreover, because the current constriction layer 15 is formed more closely to the active layer 5 than the case of the first embodiment, the current constriction effect increases and thereby the threshold value of a laser beam can be decreased.

The p-InGaP layer 13 on the convex portion 12 is formed to decrease the difference between energy band gaps of the AlGaInP cladding layer 11 and the GaAs contact layer 16 on the layer 11.

(Third embodiment)

Though this embodiment has a structure almost the same as that of the second embodiment, it differs from the second embodiment in that an n-GaAs current constriction layer is formed on a portion nearby the output edge of the convex portion 12 of the p-AlGaInP cladding layer.

Figure 8:
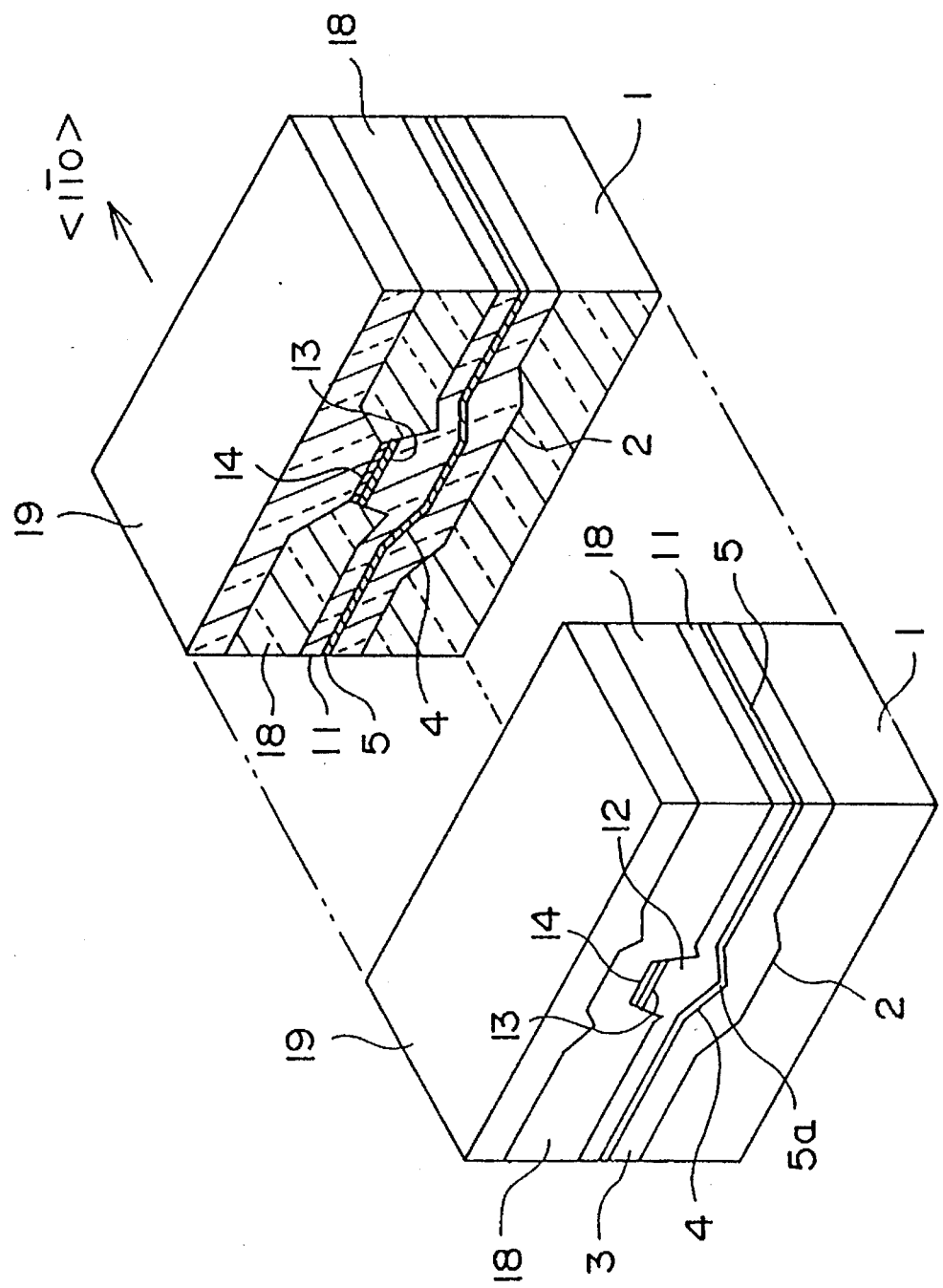
FIG. 8 is a perspective sectional view showing the semiconductor laser of the third embodiment of the present invention.

FIG. 8 shows a perspective sectional view of the second embodiment.

For this semiconductor laser, not only the energy band gap increase portion 5a is provided at the edge of the active layer 5 but a current constriction layer 18 is formed on a portion nearby the edge of the active layer 5. Therefore, because generation of heat is prevented in the output edge region, the laser output causing a COD breakdown further increases and the edge is hardly deteriorated.

The steps of forming the semiconductor laser of this embodiment are described below by referring to FIGS. 7A to 7D.

Figure 7A:
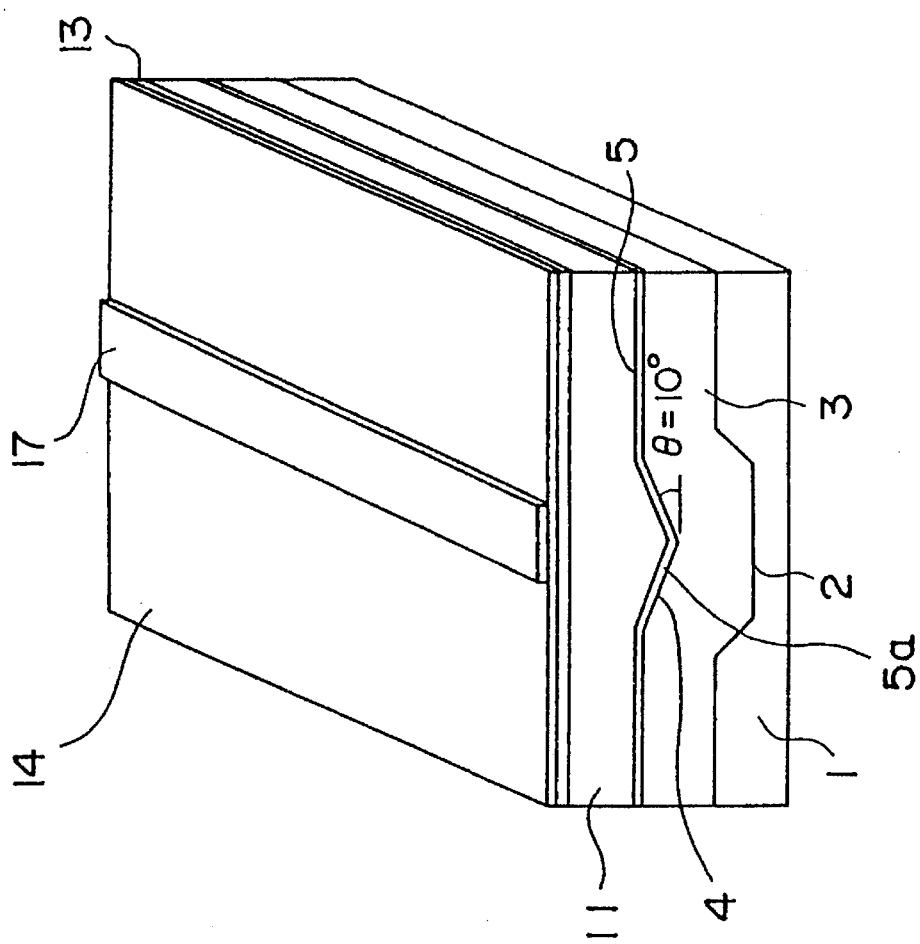
FIGS. 7A to 7D are perspective views showing the steps of manufacturing the semiconductor laser of the third embodiment of the present invention.

First, as shown in FIG. 7A, a groove 2 provided with a tapered slope at both sides is formed at the depth of 1 μm on the (001) plane of an n-GaAs substrate 1. The groove 2 extends in the <1 1̄0> direction and has a non-uniform width so that the width nearby the light output edge decreases to 10 μm and that of the opposite edge increases to 16 μm. Moreover, it is permitted that the groove 2 is tapered as shown in FIG. 7A or it changes stepwise. The slopes of both sides of the groove 2 have the A-plane.

Figure 7B:
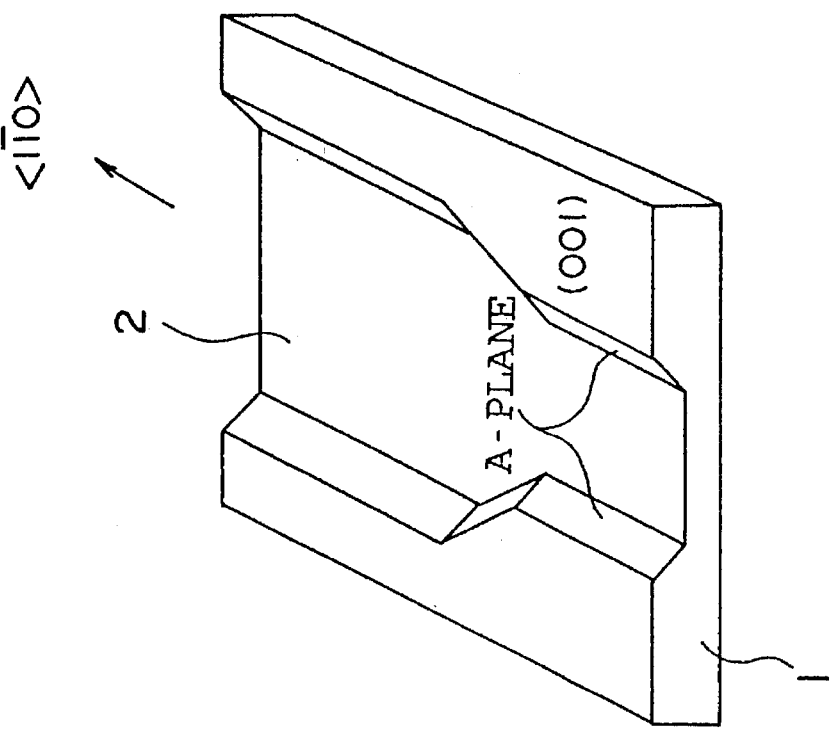
Figure 7D:
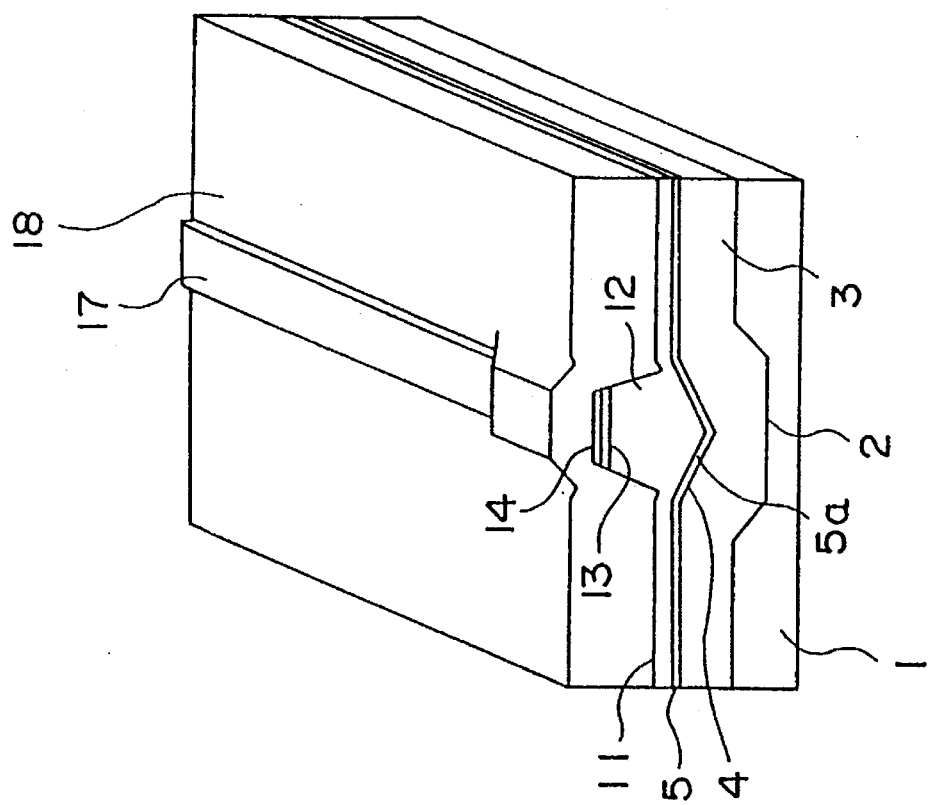

Thereafter, as shown in FIG. 7B, by forming an n-Al$_x$Ga$_{1-x}$InP (x=0.7) cladding layer 3 up to a thickness of approx. 2 μm by means of MOVPE, a V-shaped slope (A-plane) 4 with an inclination of approx. 10° and a width of approx. 5 μm is formed on a region of the groove 2 where the width of the groove 2 is small on the cladding layer 3 and a concave portion (not illustrated) having a tilted lateral is formed on the other portion of the groove 2.

Then, by forming a non-doped InGaP active layer 5 on the cladding layer 3 up to the thickness of 0.1 μm by means of MOVPE; In, Ga, and P source gases are arranged in a certain order to form a natural super lattice structure on a plane parallel with the substrate 1 and moreover they form a disorderly combined structure on the V-shaped slope 4 of the cladding layer 3. The energy band of the disorderly InGaP has an energy band gap approximately 30 mev larger than that of the InGaP of the natural super lattice structure. Thereafter, a p-Al$_x$Ga$_{1-x}$InP (x=0.7) cladding layer 11, a p-InGaP layer 13, and a p-GaAs layer 14 are formed in order up to the thicknesses of 2, 0.1, and 0.2 μm respectively by means of MOVPE. In this case, the surface of the p-GaAs layer 14 which is the top layer becomes almost flat.

Then, an SiO$_2$ film is formed by CVD and thereafter it is patterned by photolithography to form a striped SiO$_2$ mask 17 with the width of 3.5 μm along the waveguide region of the active layer 5.

Figure 7C:
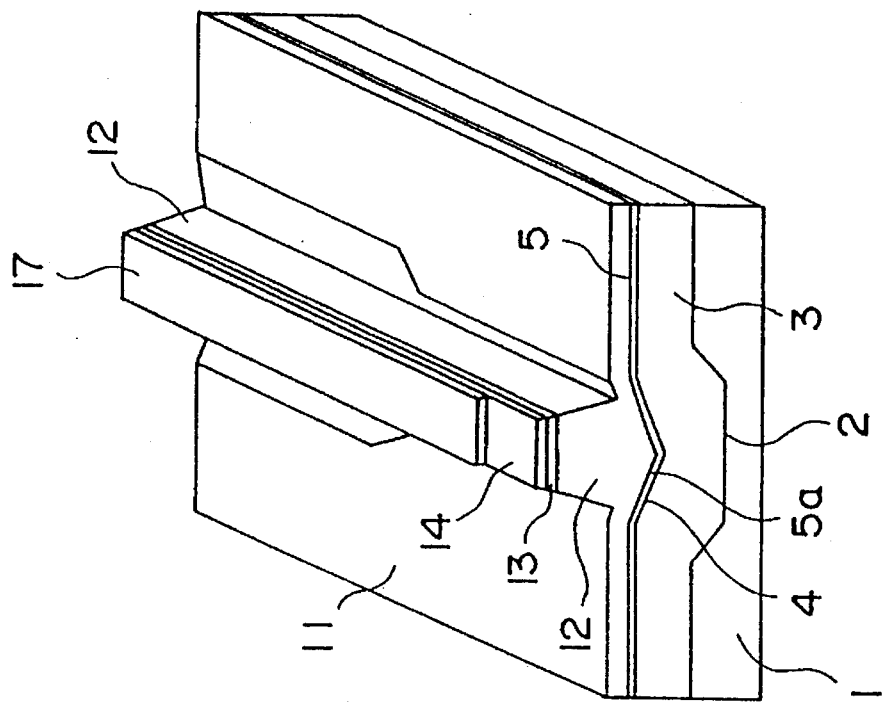

Then, by etching each semiconductor layer at the both sides of the SiO$_2$ mask 17 up to a depth where the p-side cladding layer 11 is slightly left, a mesa-shaped convex portion 12 is formed along the waveguide on the cladding layer 11 to become a ridge structure as shown in FIG. 7C.

The structure of the second embodiment is obtained by forming an n-GaAs current constriction layer at the lateral of the convex portion 12, removing the SiO$_2$ mask 17, and forming a p-GaAs contact layer on the entire surface of the layer. For the third embodiment, however, the SiO$_2$ mask 17 above the V-shaped slope 4 is locally removed. Then, by selectively growing n-GaAs in a region not covered with the SiO$_2$ mask 17 by means of MOVPE, an n-GaAs current constriction layer 18 is formed at the both sides of the convex portion 12 of the cladding layer 11 and in the vicinity of the output edge of the layer 11.

Then, the SiO$_2$ film 17 is removed by hydrofluoric acid and thereafter a p-GaAs contact layer 19 is formed on the entire surface of the layer 18. FIG. 8 is an exploded view at this stage.

Thereafter, a p-electrode (not illustrated) made of an Au-Zn-Au laminate is formed on the contact layer and moreover an n-electrode (not illustrated) made of an AuGe-Au laminate is formed under the GaAs substrate 1. Then, the substrate 1 and each semiconductor layer are cleft so that a V-shaped energy band gap increase portion serves as an edge and the length of an oscillator comes to 700 μm, and thereafter a low-reflectance film (not illustrated) made of SiO$_2$ with the reflectance of 10% is formed at the window edge of each semiconductor layer and a high-reflectance film (not illustrated) with the reflectance of 90% made by laminating two pairs of an SiO$_2$ film and an Si film is formed at the edge opposite to the window edge.

The semiconductor laser formed through the above steps oscillates at the threshold current of 70 Ma and a preferable result is obtained that the output causing a COD breakdown is 100 Mw or more. Moreover, a preferable result is obtained that the beam divergence is 12° in the transverse direction.

(Fourth embodiment)

Figure 9A:
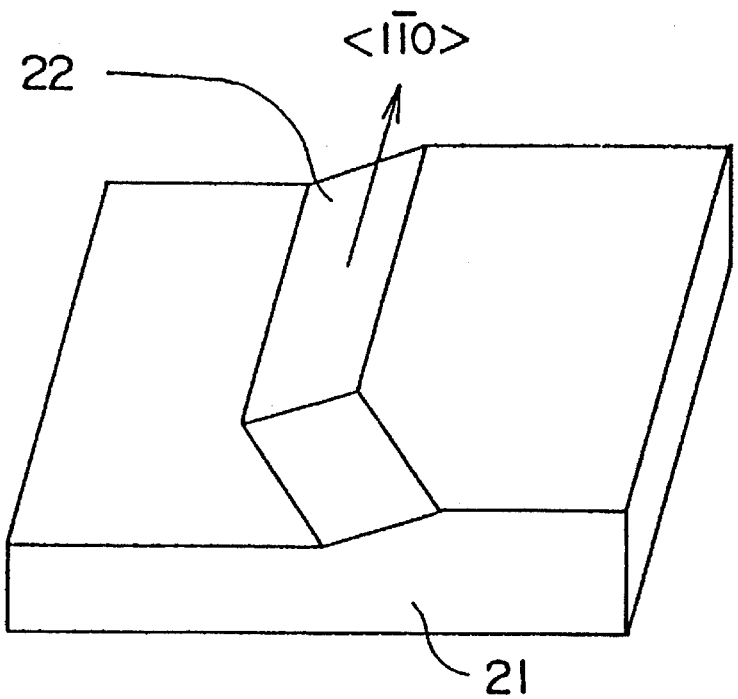
FIG. 9A is a perspective view showing the substrate constituting the semiconductor laser of the fourth embodiment of the present invention.
Figure 9B:
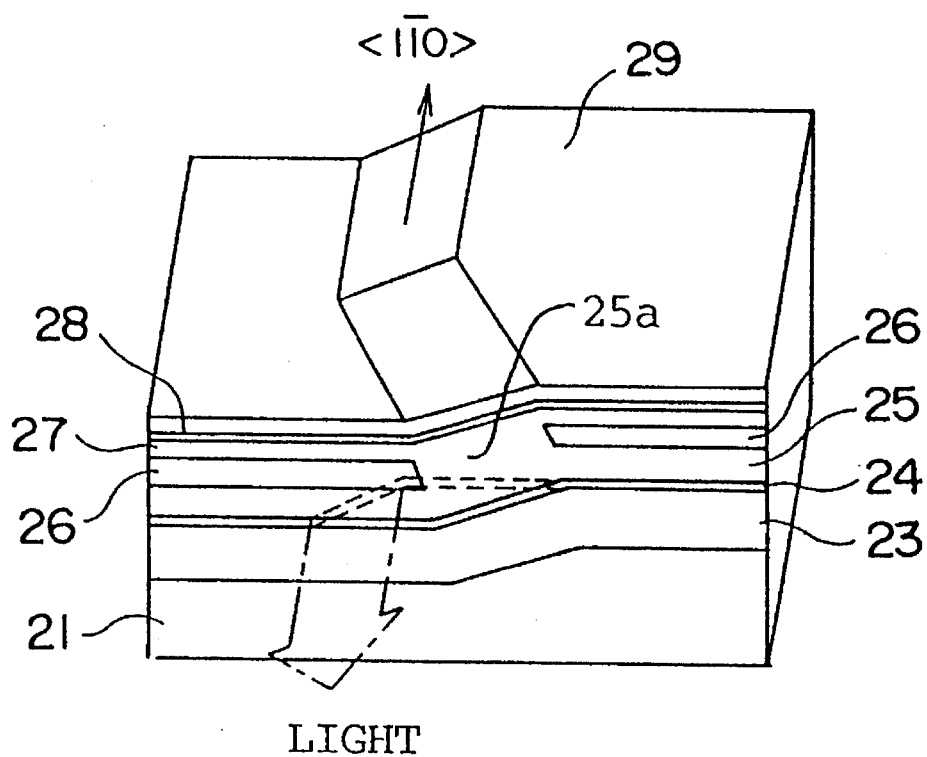
FIG. 9B is a perspective view showing the semiconductor laser of the fourth embodiment of the present invention.

FIGS. 9A and 9B are perspective sectional views of the device showing the fourth embodiment of the present invention.

In FIG. 9A, the top of an n-GaAs substrate 21 has a plane tilted by 6° off toward the <110> direction from the (001) plane, that is, a plane being by 6° off toward <110>. And, a terrace having a mesa-shaped slope 22 with an inclination of approximately 20° is formed on the plane. The slope 22 extends in the <1 $\bar{1}$0> direction which is the waveguide direction in the central region of the substrate and has a striped shape bent by approximately 30° from the <1 $\bar{1}$0> direction at the vicinity of the light output edge.

Thereby, both the top of the n-GaAs substrate 21 and the slope 22 become the so-called A-plane.

As shown in FIG. 9B, an n-(Al$_{0.7}$Ga$_{0.3}$)InP cladding layer 23, an InGaP active layer 24, and a p-(Al$_{0.7}$Ga$_{0.3}$)InP cladding layer 25 are formed up to the thicknesses of 2, 0.03, and 2 μm respectively according to film deposition by MOVPE on the substrate with the slope 22 formed on it.

Moreover, an n-(Al$_{0.7}$Ga$_{0.3}$)InP layer 26 is formed on the p-(Al$_{0.7}$Ga$_{0.3}$)InP cladding layer 25 in the region along the both sides of the slope 22. And a p-(Al$_{0.7}$Ga$_{0.3}$) InP layer 25a is formed on the cladding layer 25 above the slope 22, and a p-AlGaInP layer 27 is formed on the layers.

An n-(Al$_{0.7}$Ga$_{0.3}$)Inp layer 26 is formed by the following method.

Figure 10:
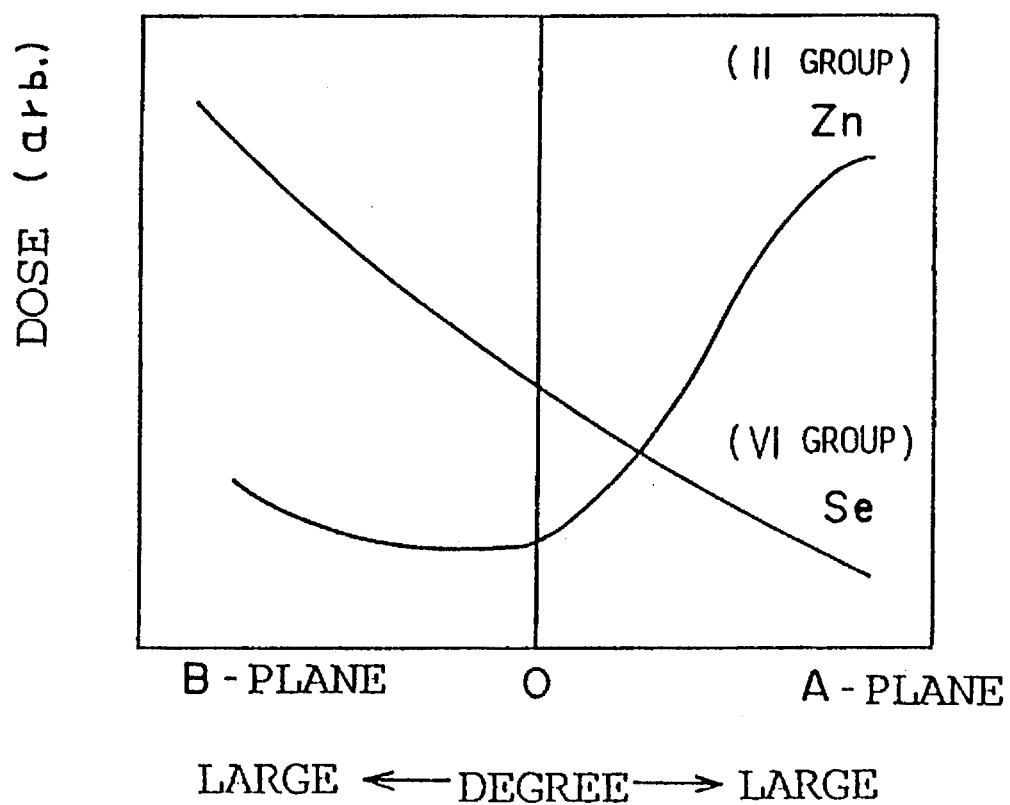
FIG. 10 is a diagram showing the relation between impurity content and slope angle according to the double doping method.

By doping III-V-group compound semiconductor with II- and VI-group elements at the same time for deposition of the semiconductor by MOVPE, more VI-group elements are incorporated if the angle of the A-plane is as small as approximately 6° but II-group elements are more easily incorporated if the angle increases to several tens of degrees as shown in FIG. 10. Therefore, by properly adjusting the doping quantities of Zn and Se and doping a film with Zn and Se at the same time to form the film, a p-type layer is formed on the slope 22 with a large off angle and an n-type layer is formed on other flat region. The n-(Al$_{0.7}$Ga$_{0.3}$)Inp layer 26 is formed by the above method.

Thus, a pnp-junction current constriction structure is formed on the both sides of the slope 22 and the active layer 24 in the striped region along the slope held by the current constriction structure serves as a pumped region.

Then, a p-GaAs contact layer 29 is formed on the p-AlGaInP layer 27 through a p-InGap layer 28. In this case, the p-InGap layer 28 is formed to change the difference between energy band edges of heterostructure by stages.

Though not illustrated, a low-reflectance film is formed on the plane at the light output edge side, a high-reflectance film is formed at the side opposite to the edge side, and moreover a p-electrode is formed on the contact layer 29 and an n-electrode is formed on the bottom of the GaAs substrate 21.

For the semiconductor laser with the above structure, the striped active layer 24 on the slope 22 serves as a pumped. However, because the active layer 24 is bent transversely in the vicinity of the output edge, not the active layer 24 but the (Al$_{0.7}$Ga$_{0.3}$)Inp layers 24, 25, and 26 at the side of the layer 24 serve as light output edges.

As a result, the energy band gap of a light output edge gets larger than the photon energy of a laser beam, light absorption at the light output edge is suppressed, and the laser output level causing a COD breakdown increases.

In the above description, the active layer 24 along the slope 22 is bent in the vicinity of an edge. Thus, the bent slope comes to have more component of the so-called B-plane direction. The B-plane appears on a III-V-group semiconductor substrate tiled in the <1 $\bar{1}$0> direction from the (001) plane, and thus VI-group elements are more easily incorporated into the B-plane than II-group elements in the case of deposition by MOVPE as shown in FIG. 10.

Figure 11:
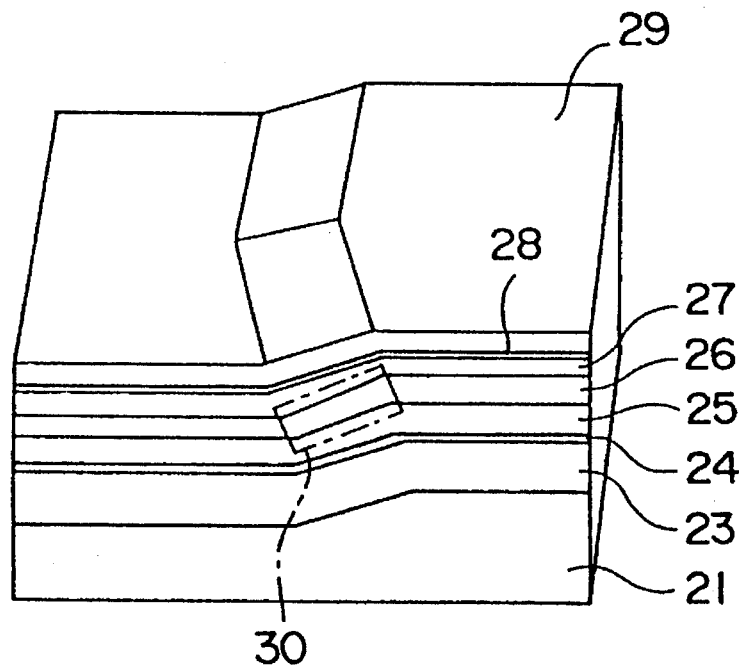
FIG. 11 is a perspective view showing the first modification of the semiconductor laser of the fourth embodiment of the present invention.
Figure 12:
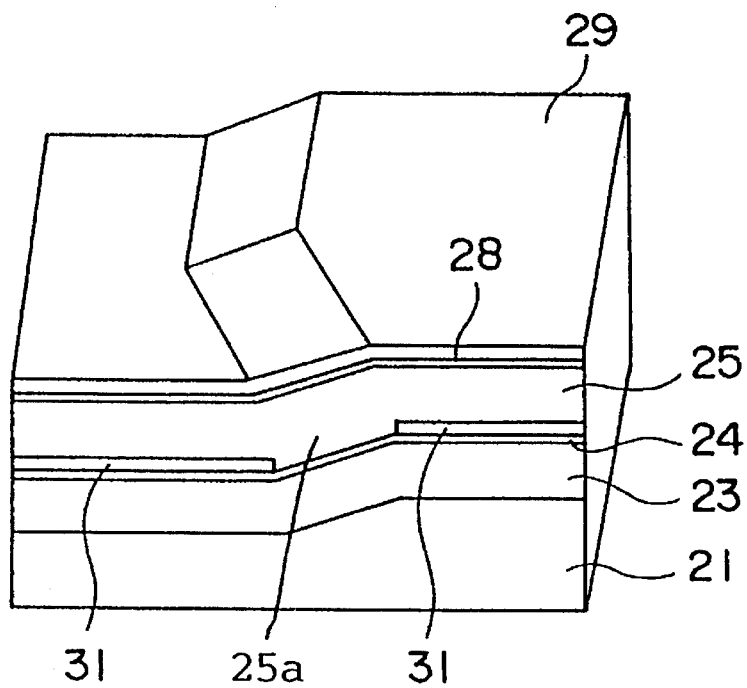
FIG. 12 is a perspective view showing the second modification of the semiconductor laser of the fourth embodiment of the present invention.

Therefore, it is possible to bring the top (the p-($Al_{0.7}Ga_{0.3}$) InP layer 25a) of the p-side cladding layer 25 on the transversely-bent slope 22 into the n-type by adjusting the bent angle and the double doping quantity of II- and VI-group elements. The structure is shown in FIG. 11 and a n-type current non-injection region 30 is formed on the edge of an active layer 24.

This makes it possible to suppress generation of heat due to current at the edge and moreover increase the output level causing a COD.

Because the current non-injection region 30 can be formed simultaneously with formation of the ($Al_{0.7}Ga_{0.3}$)InP layer 26 for current constriction by means of double doping, a new step of forming the region 30 is unnecessary and mass production of it can be realized.

The above structure is made by forming the p-side cladding layers 25 and thereafter forming the ($Al_{0.7}Ga_{0.3}$)InP layer 26 for current constriction by means of double doping. However, it is also possible to adopt a remote junction layers by means of forming an n-($Al_{0.7}Ga_{0.3}$) InP layer 31 on the active layer 24 out of the pumped region and forming the p-($Al_{0.7}Ga_{0.3}$) InP layer 25a on the active layer 24 in the pumped region by double doping. This decreases the threshold current for laser oscillation.

Moreover, it is possible to combine the remote junction layer with the above-mentioned pnp current constriction structure.

(Fifth embodiment)

Figure 13:
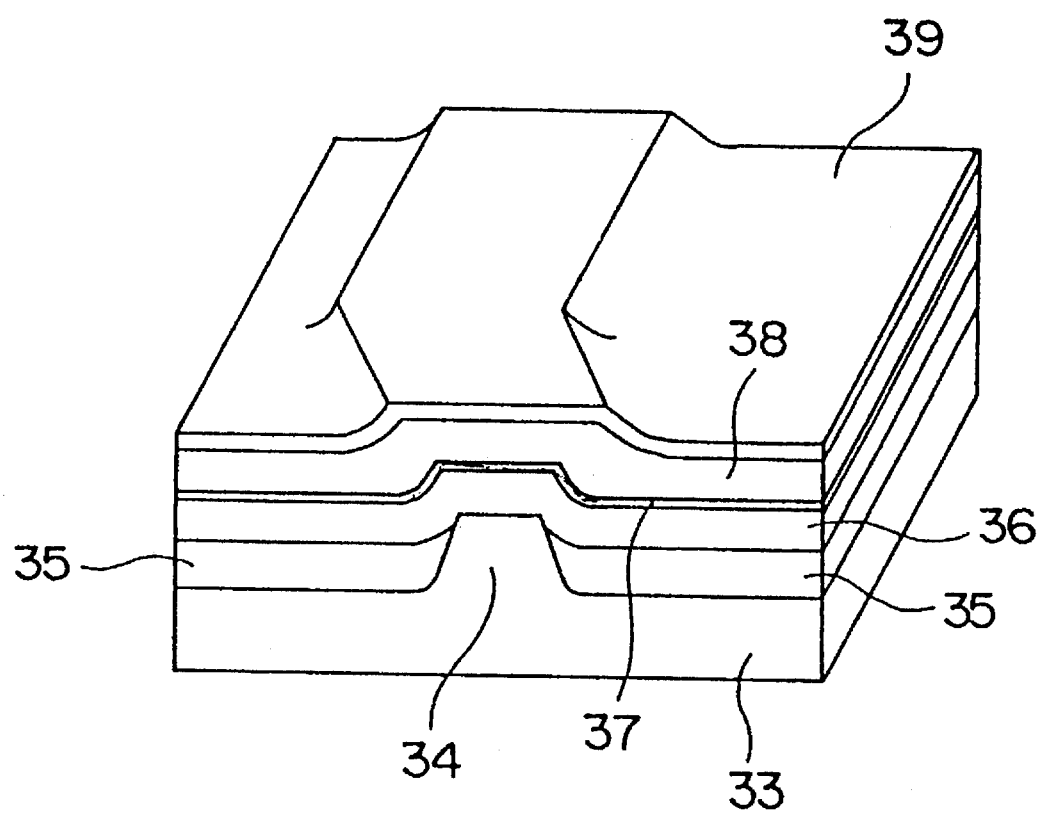
FIG. 13 is a perspective view showing the semiconductor laser of the fifth embodiment of the present invention.

FIG. 13 is a perspective sectional view showing the semiconductor laser of the fifth embodiment of the present invention.

In FIG. 13, a stripe 34 with mesa-shaped cross section is protruded on a p-GaAs substrate 33. The stripe 34 linearly extends except the vicinity of the output edge and is bent transversely in the vicinity of the output edge. Moreover, the following layers are formed on the substrate 33 by MOVPE.

First, an n-GaAs buried layer 35 is formed at both sides of the mesa-shaped stripe 34 up to the thickness of 1 μm and a p-AlGaInP cladding layer 36 is formed on the buried layer 35 up to the thickness of 2 μm. In this case, the top of the cladding layer 36 is formed into a mesa-shaped stripe.

Moreover, a non-doped InGaP active layer 37 with the thickness of 0.03 μm, an n-AlGaInP cladding layer 38 with the thickness of 2 μm, and an n-GaAs contact layer 39 with the thickness of 0.5 μm are formed in order on the cladding layer 36.

Though not illustrated, an n-electrode is formed on the contact layer 39 above the mesa-shaped stripe 34 and a p-electrode is formed under the GaAs substrate 33.

In the case of this embodiment, because terraces are formed on the active layer 37 along the shape of mesa-shaped stripe 34 of the GaAs substrate 33, a striped portion put between the slopes serves as a pumped region. In this case, because the striped active layer 37 is transversely bent along the substrate in the vicinity of the output edge, not the active layer 37 but the n-side cladding layer 38 serves as the output edge of the light going straight on. Because the cladding layer 38 is made of AlGaInP, it has a larger energy band gap than the active layer 37 made of InGaAs.

As a result, the light absorption value at the light output edge decreases and the level of a COD which is a fusion breakdown increases.

(Sixth embodiment)

Figure 14A:
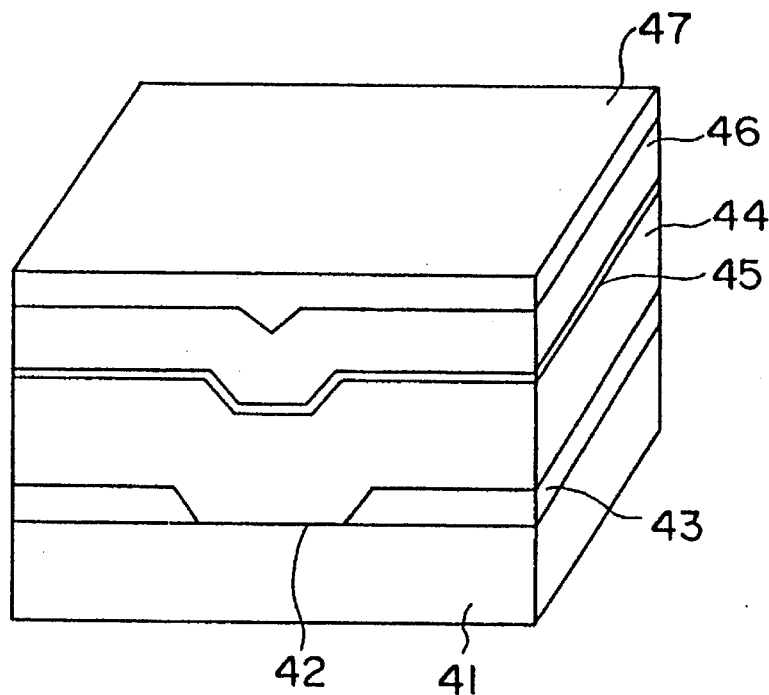
FIG. 14A is a perspective view and top view of the semiconductor laser of the sixth embodiment of the present invention.

FIG. 14A is a perspective sectional view showing the semiconductor laser of the sixth embodiment of the present invention.

Figure 14B:
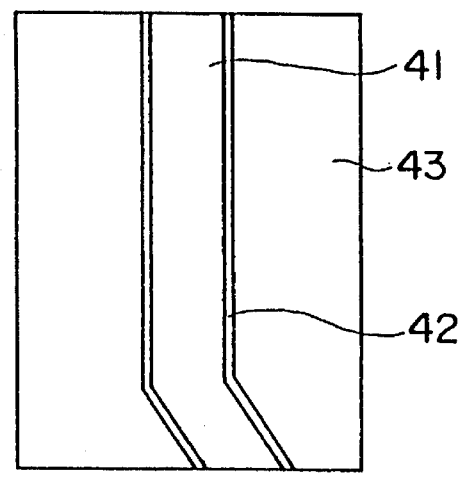
FIG. 14B is a top view of the groove of the semiconductor layer on the substrate of the sixth embodiment of the present invention.

In FIG. 14A, an n-GaAs layer 43 having a groove 42 whose cross section is formed into a reverse-mesa shape. The groove 42 linearly extends in the waveguide direction except the vicinity of the light emitting edge and is transversely bent in the vicinity of the light emitting edge as shown FIG. 14B.

A plurality of layers are formed on a GaAs substrate 41 by means of MOVPE.

First, a p-AlGaInP cladding layer 44 is formed on a groove 42 and an n-GaAs layer 43 up to the thickness of 2 μm and the groove is also transferred onto the cladding layer 44. An InGap active layer 45 with the thickness of 0.03 μm, an n-AlGaInP cladding layer 46 with the thickness of 2 μm, and a contact layer 47 with the thickness of 0.5 μm are formed in order on the cladding layer 44.

Though not illustrated, an n-electrode is formed on the contact layer 47 above the groove 42 and a p-electrode is formed under the GaAs substrate 41.

In the case of this embodiment, as the active layer 45 is bent along the groove of the cladding layer 44 under the active layer 45, a striped pumped region is formed on the groove of the active layer 45. Moreover, because the edge of the active layer 45 is transversely bent in the vicinity of the light emitting edge, not the active layer 45 but the p-side cladding layer 44 serves as an actual light output edge.

Because the cladding layer 44 is made of AlGaInP, the energy band gap at the light emitting plane gets larger than that of the InGaAs active layer 45, light absorption at the edge decreases, and a COD fusion breakdown is suppressed.

(Other embodiments)

Figure 15A:
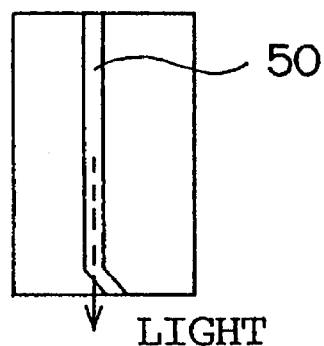
FIGS. 15A to 15F are top views showing semiconductor lasers of other embodiments of the present invention.
Figure 15B:
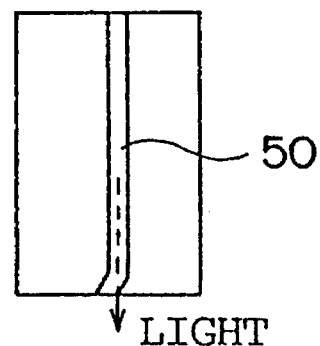
Figure 15C:
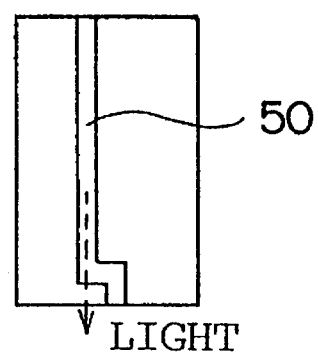
Figure 15D:
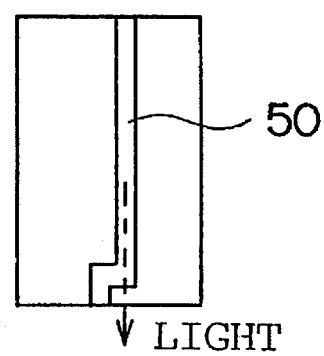
Figure 15E:
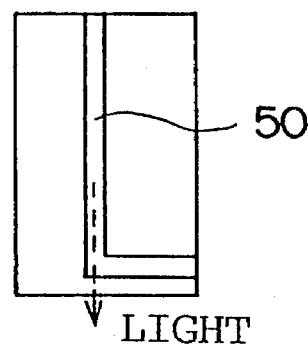
Figure 15F:
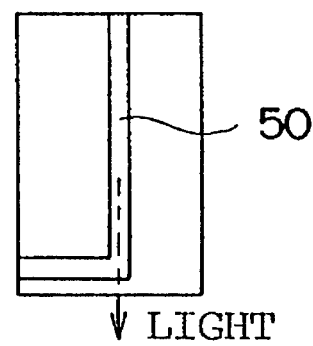

For the above fourth to sixth embodiments, it is possible to bend transversely the surface shape nearby the output edge of a striped active layer 50 diagonally rightward or leftward off the light advancing direction as shown in FIG. 15A or 15B, bend it rightward or leftward stepwise as shown in FIG. 15C or 15D, or form it into an L Shape as shown in FIG. 15E or 15F. Any one of these bends can be applied to every semiconductor laser having a structure in which an active layer is terraced to control the transverse mode. In this case, it is only necessary to modify the existing pattern design but it is unnecessary to add a new step.

What is claimed is:

1. A semiconductor laser comprising:

electrodes for supplying an electric current, which drives said semiconductor laser;

a substrate having a groove;

a first cladding layer formed on the substrate;

an active layer formed on the first cladding layer, wherein active layer at one edge for outputting light is formed into a V-shape and the active layer at the other edge is formed in a concave shape with a flat bottom;

a second cladding layer formed on the active layer; and a contact layer coupled to the second cladding layer.

2. The semiconductor laser according to claim 1, wherein a energy band gap of the one edge formed into the V-shape of the active layer is wider than a energy band gap of the other edge of formed into concave shape of the active layer.

3. The semiconductor laser according to claim 1, wherein the width of the V-shaped region of the active layer is smaller than that of the concave region.

4. A semiconductor laser comprising:

a substrate;

a first-conducting-type cladding layer formed on the substrate having a groove whose one edge for outputting light is narrower than the other edge;

an active layer epitaxial-grown along the top of the first conducting-type cladding layer, in which the layer at one edge for outputting light is formed into a V-shape and the layer at the other edge is formed into a concave shape with a flat bottom;

a second-conducting-type cladding layer formed on the active layer; and a contact layer coupled to the second-conducting-type cladding layer.

5. The semiconductor laser according to claim 4, wherein the width of the V-shaped region of the active layer is smaller than that of the concave region of it.

6. The semiconductor laser according to claim 4, wherein the second-conducting-type cladding layer above the groove of the first-conducting-type cladding layer is a thickly-formed mesa-shape and a first-conducting-type current constriction layer is formed at the both sides of the mesa-shape.

7. The semiconductor laser according to claim 4, wherein a first-conducting-type current stopping layer is formed on the V-shaped region of the active layer of the second-conducting-type cladding layer.

8. A semiconductor laser comprising:

a substrate having a surface having a first striped slope which is bent transversely off a light advancing direction in the vicinity of a light output edge;

a first-conducting-type cladding layer formed on the surface having the first slope of the substrate, in which a second slope is present on the first slope;

an active layer formed on the first-conducting-type cladding layer, in which a third slope is present on the second slope;

a second-conducting-type cladding layer formed on the active layer; and a current constriction structure formed at the both sides of the third slope of the active layer.

9. The semiconductor laser according to claim 8, wherein the first to third slopes have the A-plane orientation and at least one of layers of the current constriction structure at the both sides of the third slope comprises a first-conducting-type compound semiconductor layer selectively formed by means of chemical vapor deposition for doping the layer with II-and VI-group elements at the same time.

10. The semiconductor laser according to claim 8, wherein a second-conducting-type current stopping layer is formed on the active layer nearby a light output edge.

11. The semiconductor laser according to claim 8, wherein the first-conducting-type compound semiconductor layer constituting the current constriction structure forms with the flat surface at the both sides of the third slope of the active layer.

* * * * *

UNITED STATES PATENT AND TRADEMARK OFFICE
CERTIFICATE OF CORRECTION

PATENT NO. : 5,568,500
DATED : October 22, 1996
INVENTOR(S) : Akira FURUYA, et al.

It is certified that error appears in the above-indentified patent and that said Letters Patent is hereby corrected as shown below:

TITLE PAGE [73] ASSIGNEE

"Kanagawa" should be --Kawasaki--.

TITLE PAGE [56] FOREIGN PATENT DOCUMENTS

Insert --0201977, 8/89, Japan--.

Column 2

Line 28, "<1 $\bar{1}$0>" should be --<1 $\bar{1}$ 0>--.

Line 34, "p-$(A_{10.7}Ga_{0.3})$InP" should be --p-$(A_{0.7}Ga_{0.3})$InP--.

Column 3

Line 13, after "into", insert --a--;

Line 15, "supper" should be --super--;

Line 18, "supper" should be --super--.

Column 4

Line 49, "<1 $\bar{1}$0>" should be --<1 $\bar{1}$ 0>--;

Line 55, "observed from the top" should be --observed from the top,--;

Line 59, "n-AlGainP" should be --n-AlGaInP--;

UNITED STATES PATENT AND TRADEMARK OFFICE
CERTIFICATE OF CORRECTION

PATENT NO. : 5,568,500
DATED : October 22, 1996
INVENTOR(S) : Akira FURUYA, et al.

It is certified that error appears in the above-indentified patent and that said Letters Patent is hereby corrected as shown below:

Column 5

Line 55, "witch" should be --with--.
    Line 61, "<1 $\bar{1}$0>" should be --<1 $\bar{1}$ 0>--.

Column 6

Line 16, "reflectiance" should be --reflectance--;
    Line 64, "<1 $\bar{1}$0>" should be --<1 $\bar{1}$ 0>--.

Column 7

Line 4, "xInP" should be --$_x$InP--;
    Line 20, "p-Al$_x$Ga$_1$_InP" should be --p-Al$_x$Ga$_{1-x}$InP--.

Column 8

Line 10, "<1 $\bar{1}$0>" should be --<1 $\bar{1}$ 0>--;
    Line 12, "<1 $\bar{1}$0>" should be --<1 $\bar{1}$ 0>--;
    Line 24, "layers" should be --layer--;

UNITED STATES PATENT AND TRADEMARK OFFICE
CERTIFICATE OF CORRECTION

PATENT NO. : 5,568,500
DATED : October 22, 1996
INVENTOR(S) : Akira FURUYA, et al.

It is certified that error appears in the above-indentified patent and that said Letters Patent is hereby corrected as shown below:

<u>Column 10</u>

Line 50, "L Shape" should be --L shape--.

Signed and Sealed this

Thirteenth Day of May, 1997

Attest:

BRUCE LEHMAN

Attesting Officer

Commissioner of Patents and Trademarks